United States Patent
Michiya

(10) Patent No.: US 6,296,493 B1
(45) Date of Patent: Oct. 2, 2001

(54) METHOD FOR ELECTRICALLY CONNECTING TWO SETS OF ELECTRODE TERMINALS IN ARRAY ON ELECTRONIC BOARD UNITS

(75) Inventor: Hajime Michiya, Nagano-ken (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 09/657,978

(22) Filed: Sep. 8, 2000

(30) Foreign Application Priority Data

Sep. 16, 1999 (JP) .................................. 11-261672

(51) Int. Cl.[7] .................................. H01R 12/00
(52) U.S. Cl. .................................. 439/66; 439/91
(58) Field of Search .................................. 439/61, 91, 66, 439/65, 149, 74; 349/159–162

(56) References Cited

U.S. PATENT DOCUMENTS

| | | | |
|---|---|---|---|
| 3,492,538 | * | 1/1970 | Fergusson .......................... 361/803 |
| 4,025,162 | * | 5/1977 | Yagi .................................. 349/58 |
| 4,028,794 | * | 6/1977 | Ritchie et al. ..................... 29/629 |
| 4,132,984 | * | 1/1979 | Gross .................................. 349/149 |
| 4,203,203 | * | 5/1980 | Gillissen et al. .................. 29/846 |
| 4,330,165 | * | 5/1982 | Sado .................................. 439/91 |
| 4,408,814 | * | 10/1983 | Takashi et al. ..................... 439/91 |
| 4,973,256 | * | 11/1990 | Peters .................................. 439/66 |
| 5,462,441 | | 10/1995 | Renn et al. . |
| 5,588,846 | | 12/1996 | Irlbeck et al. . |
| 5,888,076 | * | 3/1999 | Itoh et al. .......................... 439/74 |

FOREIGN PATENT DOCUMENTS 0 613 218    8/1994   (EP) .

* cited by examiner

Primary Examiner—Brian Sircus
Assistant Examiner—Son V. Nguyen
(74) Attorney, Agent, or Firm—Wenderoth, Lind & Ponack, L.L.P.

(57) ABSTRACT

The present invention includes an efficient method for electrically connecting two sets of electrode terminals in respective arrays on respective electronic board units, such as a combination of a liquid crystal display panel (LCD panel) and a circuit board therefor assembled as a display unit, by interposing a press-contact connector therebetween. Instead of simply interposing the connector between arrays of electrode terminals, the connector is conjoined with a clip member of a metal by which the connector is secured to the LCD panel or circuit board by clipping a periphery thereof with resilient clipping parts at both end portions of the clip member. The resulting efficiency and reliability of the assemblage of a LCD panel and circuit board can be greatly improved.

10 Claims, 6 Drawing Sheets

METHOD FOR ELECTRICALLY CONNECTING TWO SETS OF ELECTRODE TERMINALS IN ARRAY ON ELECTRONIC BOARD UNITS

BACKGROUND OF THE INVENTION

The present invention relates to a method for electrically connecting two sets of electrode terminals in array on the respective electronic board units such as a combination of a liquid crystal display panel, which may be referred to as a LCD panel hereinafter, and circuit board for driving the LCD panel. More particularly, the invention relates to a method for electrically connecting two sets of electrode terminals on the respective electronic board units such as a combination of two circuit boards and a combination of a LCD panel and a circuit board for driving the LCD panel by using a press-contact connector interposed therebetween.

Although the following description is given mainly for the combination of a LCD panel and a circuit board therefor, it may be too much to say that the scope of the present invention can be extended to any combinations of two electronic board units each bearing an array of electrode terminals.

It is a widely practiced prior art method for electrically connecting two sets of electrode terminals in array on the respective electronic board units such as a LCD panel and a heat-adhesive circuit board therefor that an anisotropic conductive film (ACF) is used for adhesively bonding a flexible printed circuit (FPC) board to the arrays of electrode terminals on the LCD panel and the circuit board under heating and pressing.

In the above mentioned method by hot-pressing with interposition of an ACF, however, it is indispensable to conduct an exact position matching work between the electrode terminals of the LCD panel and the electrode terminals of the circuit board so that the productivity of the assemblage process involving the above mentioned positioning work cannot be high enough.

Besides the above mentioned disadvantage of low productivity, the above mentioned electrical connecting method by hot-press bonding has a problem that the LCD panel is sometimes damaged by the pressure under heating. When the LCD panel is of the chip-on-glass (COG) type, in particular, the residual stress due to hot-press bonding causes a load on the LCD panel per se or the LCD panel-driving ICs resulting in softening of the ACF connecting the IC by the heat of hot-press bonding to cause failure of electrical connection of the IC for LCD panel driving.

The above mentioned troubles due to the heat in hot-press bonding can of course be alleviated by decreasing the temperature of hot-press bonding but at the sacrifice of the adhesive bonding strength of the ACF and reliability of electrical connection therewith.

Another serious problem in the above mentioned method for electrical connection is that, once a LCD panel and a circuit board have been connected together by hot-pressing of an ACF, the assemblage can hardly be disassembled into the respective parts without damaging the parts more or less even in need for testing or inspection desirably followed by repairing. Accordingly, it is the usual way that, when disorder is found in the assemblage, the most expensive LCD panel must be discarded even when the performance disorder is not due to the LCD panel per se.

SUMMARY OF THE INVENTION

The present invention accordingly has an object, in view of the above described problems and disadvantages in the prior art method for electrically connecting a LCD panel and a circuit board by using an ACF, to provide an easy and efficient method for electrically connecting two sets of electrode terminals in array on the respective electronic board units such as a combination of a LCD panel and a circuit board therefor without necessitating discarding of the expensive LCD panel in re-assembling the parts after disassemblage into parts for inspection or repairing.

The method provided by the invention is a method for electrically connecting two sets of electrode terminals in array each on an electronic board unit by interposing a press-contact connector having conductive bodies between the arrays of the electrode terminals on a first electronic board unit and on a second electronic board unit which comprises the steps of:

(a) integrating a press-contact connector with a clip member of a metallic material having clipping parts to form a connector device;

(b) securing the connector device to the first electronic board unit by clipping a periphery thereof with the clipping parts at a position not on the electrode terminal array thereof in such a fashion that the electrode terminal array is in contact with the conductor bodies of the press-contact connector;

(c) bringing the conductor bodies of the press-contact connector into contact with the electrode terminal array of the second electronic board unit; and (d) compressing the press-contact connector between the electrode terminal array of the first electronic board unit and the electrode terminal array of the second electronic board unit so as to electrically connect the electrode terminals of the first and second electronic board units through the conductor bodies of the press-contact connector.

DETAILED DESCRIPTION OF THE PREFERRED EMBODIMENTS

In the following, a detailed description is given on an embodiment of the inventive method for electrically connecting a LCD panel and a circuit board by using a press-contact connector making reference to the accompanying drawings.

Figure 1:
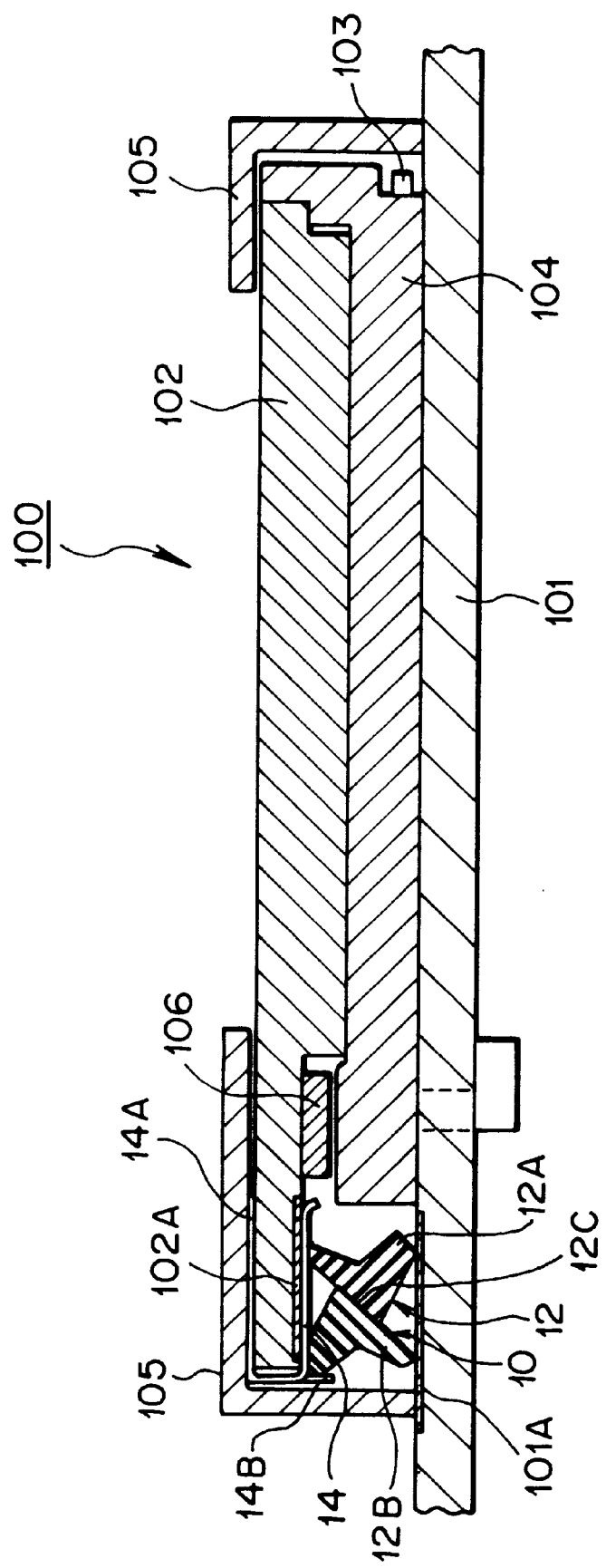
FIG. 1 is a cross sectional illustration of the inventive method for electrically connecting a LCD panel and a circuit board by using a connector device.
Figure 2:
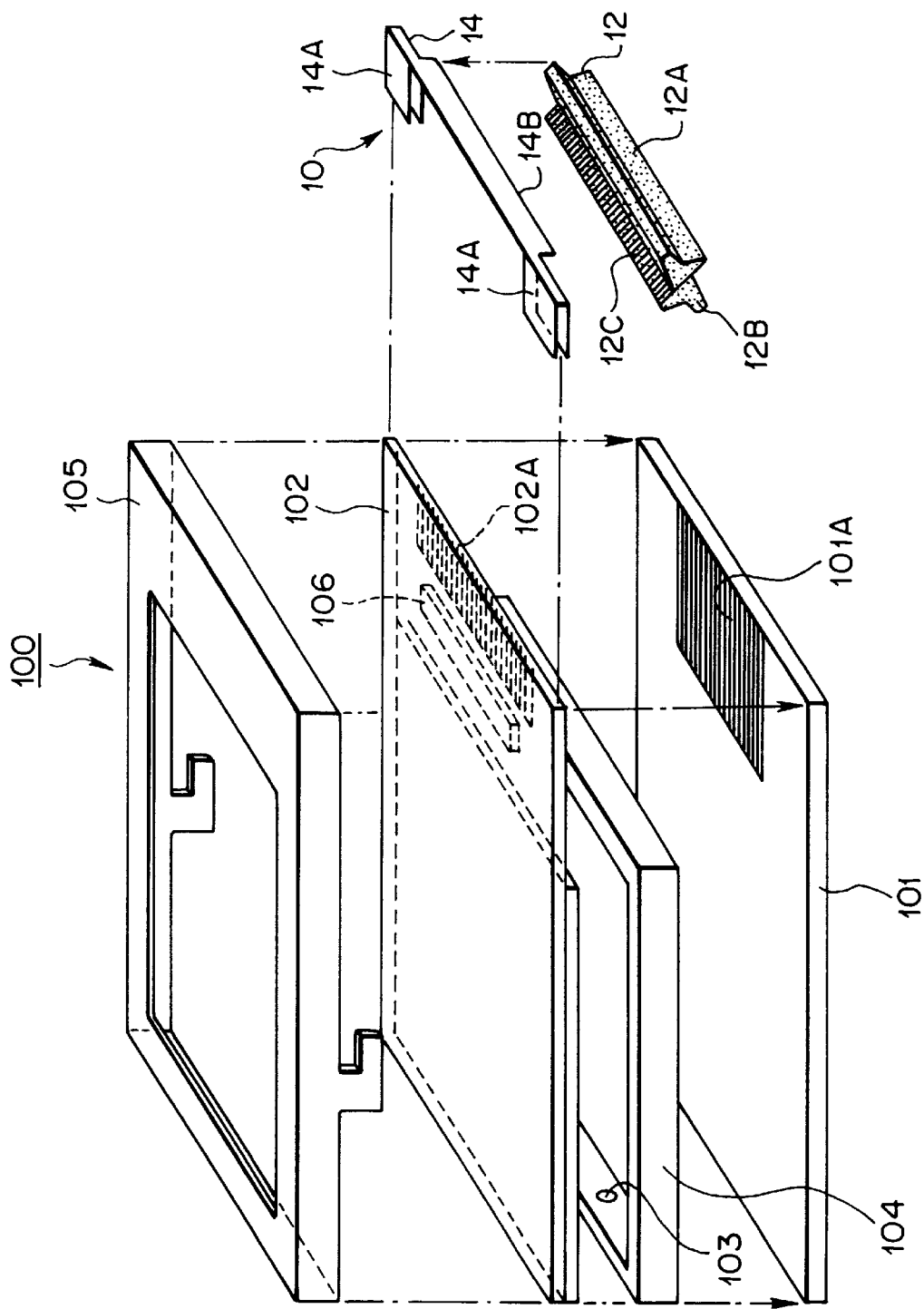
FIG. 2 is a perspective view of the LCD panel assemblage of FIG. 1 disassembled into parts.

FIG. 1 is a vertical cross sectional view of the LCD panel unit 100 assembled according to an embodiment of the inventive method by using a connector device 10. FIG. 2 is a perspective view of the same LCD panel unit 100 as above as disassembled into parts including a circuit board 101, LCD panel 102, LED 103 for backlighting, light guide 104 for conducting the light of LED 103 to the back surface of the LCD panel 102, shield case 105 and IC 106 for LCD panel driving as well as an electrode terminal array 101A formed on the circuit board 101 and an electrode terminal array 102A formed on the LCD panel 102. These electrode terminal arrays 101A and 102A are electrically connected through the connector device 10.

The connector device 10 is an integration of a press-contact elastomer connector 12 and a clip member 14 made from a metallic material. Electrical connection of the circuit board 101 and the LCD panel 102 is accomplished in the following manner. The press-contact elastomer connector 12 of the connector device 10 is attached to the electrode terminal array 102A of the LCD panel 102 by clipping a periphery of the LCD panel with the clipping parts 14A, 14A of the metal-made clip member 14 and then the press-contact elastomer connector 12 is compressed between the LCD panel 102 and the circuit board 101 so as to establish an electrical connection between the electrode terminal arrays 102A and 101A on the LCD panel 102 and circuit board 101, respectively. The detailed structure of the connector device 10 will be described later in Example 1.

Figure 6A:
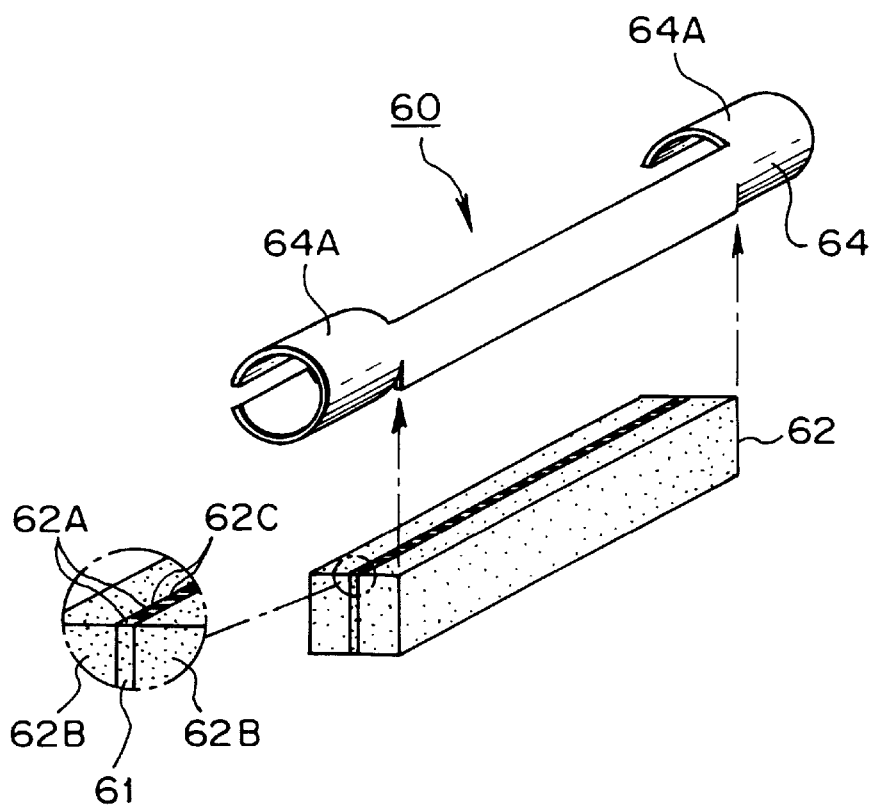
FIG. 6A is a perspective view of the connector device of Example 5 disassembled into a press-contact connector and a clip member and FIG. 6B is a perspective view thereof as integrated.
Figure 6B:
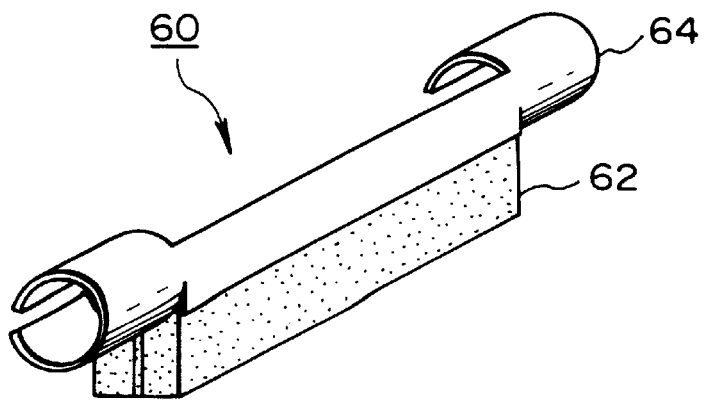

The type of the press-contact connector is not particularly limited, but the connector should be selected in consideration of the driving electric current for the LCD panel. For example, the elastomer connector 62 of only a limited current capacity illustrated in FIGS. 6A and 6B is sufficient for the purpose when the IC for driving the liquid crystal cells is mounted on the circuit board, and the input current to the LCD panel is not too large. On the other hand, the elastomer connector 62 of this type is not suitable when the liquid crystal-driving IC is mounted directly on the LCD panel, requiring a relatively large electric current, because this elastomer connector has a high electric resistance and a small current capacity. A high electric resistance and small current capacity results in eventual heat generation from the electric current therethrough, or eventual delay or loss of signals.

In case where the elastomer connector 62 illustrated in FIGS. 6A, 6B is not suitable, the press-contact connector to be used should be a press-contact connector of a larger current capacity prepared by using a multiplicity of finely slitted metal foils, fine metal wires, or filaments. Non-limiting examples include the connector 12, having a generally X-formed cross section as illustrated in FIG. 1; the metal filament connector 32, having a U-formed cross section illustrated in FIGS. 3A, 3B; and the metal wire connectors 42 and 52, illustrated in FIGS. 4A, 4B and FIGS. 5A, 5B, respectively.

Figure 4A:
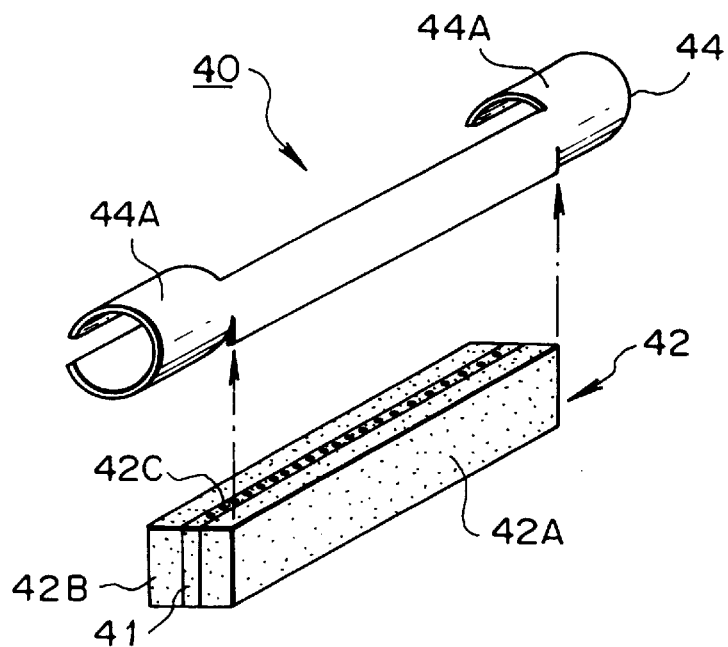
FIG. 4A is a perspective view of the connector device of Example 3 disassembled into a press-contact connector and a clip member and FIG. 4B is a perspective view thereof as integrated.
Figure 4B:
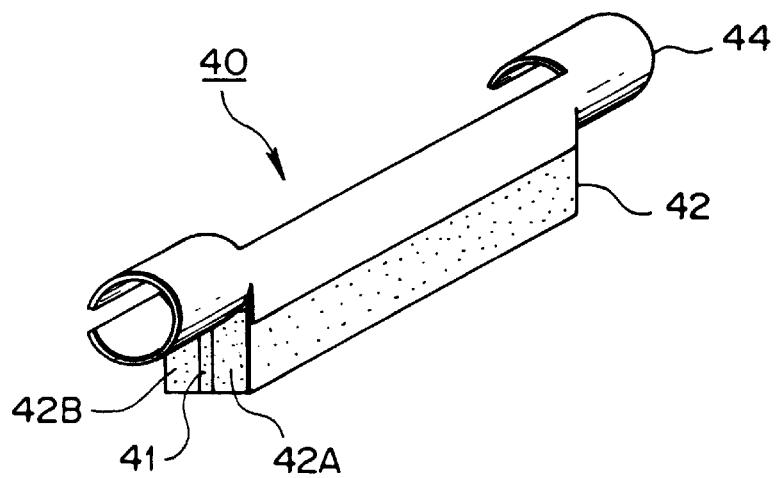
Figure 5A:
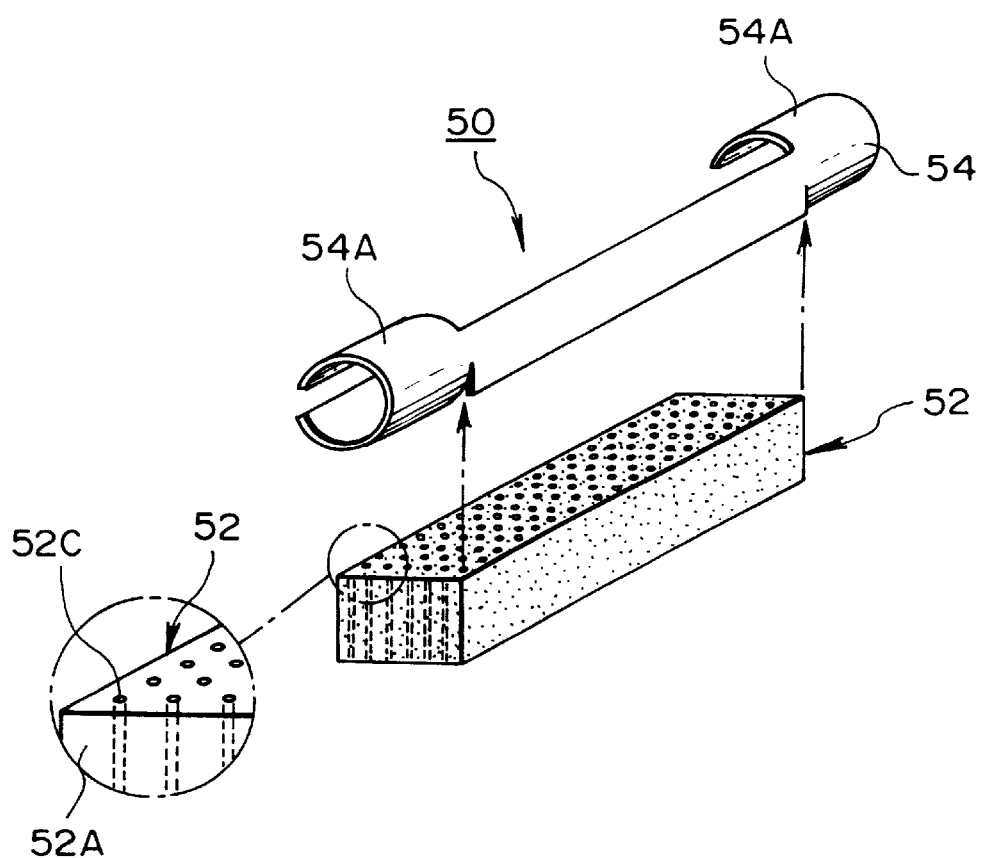
FIG. 5A is a perspective view of the connector device of Example 4 disassembled into a press-contact connector and a clip member and FIG. 5B is a perspective view thereof as integrated.
Figure 5B:
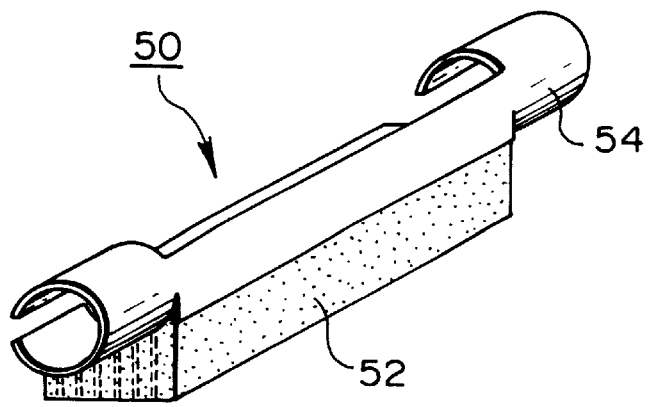

The above mentioned metal filament connector 52 illustrated in FIGS. 5A, 5B is prepared by alternately laminating layers of fine metal filaments 52C aligned to run in the same direction at a regular pitch and unvulcanized rubber sheets 52A in such a fashion that all of the metal filaments 52C in the metal filament layers run in one and the same direction followed by curing of the rubber sheets 52A by heating under compression to integrate the metal filament layers and the rubber sheets into an integral block which is subsequently sliced in a plane perpendicular to the running direction of the metal filaments 52C. This metal filament connector 52 can be a substitute for the metal filament connector 42 illustrated in FIGS. 4A, 4B.

It is a remarkable trend in recent years that the mechanical strength of ICD panels per se is decreasing year by year in order to comply with the requirement for smaller and smaller thickness and lighter and lighter weight of LCD panels. It is accordingly desirable that the press-contact connector is the X-formed connector 12, illustrated in FIG. 1, by virtue of the advantage that the compressive load on the connector 12 under electrical connection can be relatively small.

When fine metal filaments obtained by slitting a metal foil are used as the conductor bodies in a press-contact connector, the metallic material thereof can be selected, though not particularly limitative, from copper, aluminum, aluminum-silicon alloys, brass, phosphor bronze, beryllium copper, nickel, nickel-titanium alloys, molybdenum, tungsten, stainless steels, iron, steels and the like. It is preferable that these metal filaments are surface-plated with gold or a gold-based alloy. More preferable are gold-plated stainless steel filaments in respects of low contact resistance and excellent elastic resilience not to cause buckling of the filaments even by repeated compression of the connector as well as relatively low costs.

The metal foil from which the filaments are prepared by slitting should have a thickness in the range from 0.01 mm to 0.5 mm or, preferably. from 0.02 mm to 0.5 mm. When the thickness is too small, the mechanical strength of the filaments is insufficient, and consequently the durability of the connector using such filaments is unsatisfactory. Furthermore, if the thickness is too small. the processability of press-contact connectors using filaments thereof decreases. When the thickness is too large, the filaments have a rigidity so high that the compressive load on the connector for press-contact connection therewith is unduly increased. Similarly, when the thickness is too large, the processability of press-contact connectors using the filaments decreases.

The metal foil can be worked into electroconductive filaments aligned at a regular pitch by several methods including the etching method, laser beam working method, punching method by using a stamping press and the like. Assuming that accuracy of the pitch is important and the electrode terminals to be connected each have a small width requiring a small pitch of, for example, 0.03 to 0.5 mm, the metal foil is preferably worked by the etching method. When the electrode terminals have a relatively large width requiring a pitch of, for example, 0.5 to 2.0 mm, the laser beam working method and punching method by using a stamping press are suitable for mass production of filaments in alignment at a low cost.

When the press-contact connector is prepared by using fine metal wires as the conductor bodies, the metallic material of the wires can be selected from gold, gold-based alloys, copper, aluminum, aluminum-silicon alloys, brass, phosphor bronze, beryllium copper, nickel, nickel-titanium alloys, molybdenum, tungsten, stainless steels, iron, steels and the like. In view of expense of gold and gold-based alloys, it is preferable to use wires of a metallic material other than gold and gold-based alloys that have a plating layer of gold or a gold-based alloy.

The metal wires should have a diameter in the range from 0.01 to 0.5 mm or, preferably, from 0.02 to 0.1 mm. When the diameter of the wires is too small, the mechanical strength of the wire is so low as to adversely affect the processability of the wires into a connector while, when the diameter is too large, the wires are so rigid that the compressive load on the press-contact connector prepared therefrom must be unduly increased.

The press-contact connector used in the inventive method can be a so-called rubber connector which is an integral body made of an alternately stratified block consisting of electroconductive rubber layers and insulating rubber layers and, optionally, reinforced by a pair of supporting members of an insulating rubber bonded to the opposite surfaces of the block perpendicular to the pressing surfaces for press-contacting.

The rubber material of the above mentioned insulating rubber layers can be selected from a variety of known rubbers including silicone rubbers, polybutadiene rubbers, natural rubber, polyisoprene rubbers, urethane rubbers, polychloroprene rubbers, polyester-based rubbers, styrene-butadiene copolymeric rubbers, epichlorohydrine rubbers and the like without particular limitations, of which silicone rubbers are preferred in respect of their excellent electric insulation and heat resistance as well as their low permanent compression set. Foamed rubbers prepared from these rubbery materials can also be used.

The above mentioned electroconductive rubber layers are formed from a rubber composition prepared by compounding the above named various insulating rubbers with a conductivity-imparting particulate material including particles of a conductive material such as carbon, graphite, gold, silver, copper, nickel and the like as well as particles of an insulating material such as plastics having a metallic plating layer on the surface.

The rubbery materials of the insulating and electroconductive rubber layers should have a relatively low rubber hardness in order to have a small compressive load on the rubber connector prepared from the rubbery materials. However, it should be taken into account that a rubbery material of lower rubber hardness is generally more susceptible to the phenomena of permanent compression set and compressive fatigue at an elevated temperature. In order to obtain a good balance between the compressive load and the permanent compression set, the rubbery materials should have a rubber hardness in the range from 10 to 70° H or, preferably, from 30 to 60° H.

The metallic material of the clip member, which should have a resilience sufficient to behave as a spring member, can be selected from a variety of metallic materials including copper, aluminum, aluminum-silicon alloys, brass, phosphor bronze, beryllium copper, nickel, nickel-titanium alloys, molybdenum, tungsten, stainless steels, iron, steels and the like, of which stainless steels are preferred as a result of their excellent resilience as a spring member, good workability and low costs.

Needless to say, the form and size of the clip member of a metal should be selected depending on the size and thickness of the LCD panel and type and size of the press-contact connector so that the clip member is designed for the respective combinations of the LCD panel and press-contact connector. It is essential, however, that a clip member has at least one or, preferably, at least two clipping parts by which the clip member is held by and secured to the LCD panel. The clip member is an elongated body having a length approximately equal to the length of the LCD panel along the periphery at which the clip member is secured to the LCD panel. This is because of the working efficiency of exact relative positioning of the LCD panel and the clip member which can be accomplished by truing up the respective end surfaces of the LCD panel and the clip member.

The clipping part of the clip member preferably has a U-formed or C-formed cross section having two free legs between which a periphery of the LCD panel is pinched to secure the clip member with resilience. However, any other forms of the clip member can be adopted, provided that such a clip member can be prepared with good efficiency in working of a metallic base material and the clip member can be secured to the LCD panel with high reliability.

The above given description relative to securing of the clip member to the LCD panel is applicable to the case where the clip member is secured to the circuit board by rewording all instances of the phrase "LCD panel" in the above given description with the phrase "circuit board". More generally, the above description is applicable to any combination of two electronic board units each bearing an array of electrode terminals by replacing the phrase "LCD panel" with the phrase "first electronic board unit." and replacing the phrase "circuit board" with the phrase "second electronic board unit".

The first and second supporting members 12A, 12B were each coated with a silicone-based adhesive in a thickness of 0.020 mm and adhesively bonded in a jig to the slitted metal sheet prepared above, followed by trimming for the metal filament alignment 12C, thereby obtaining a press-contact connector 12 having a generally point-symmetrical X-formed cross section (see FIG. 2) having a width of 1.5 mm, height of 1.5 mm and length of 15 mm, wherein the aligned metal filaments 12C serve as the electroconductor body.

EXAMPLE 1

Following is a description of the preparation procedure of the connector device 10 illustrated in FIGS. 1 and 2 by a vertical cross sectional view and a perspective view of the disassembled parts, respectively.

A 30 mm by 100 mm wide rectangular stainless steel sheet of 0.050 mm thickness was subjected to an etching treatment on the 10 mm by 80 mm wide area excepting the 10 mm wide framing area to form 10 mm long slits at a pitch of 0.07 mm followed by a dual plating treatment first with nickel for underplating and then with gold for top plating.

Separately, the supporting members 12A,12B of an insulating silicone rubber of 50° H rubber hardness each having an approximately V-formed cross section were prepared by molding a curable silicone rubber composition and heating the same at 120° C. for 5 minutes under compression. These supporting members 12A, 12B are referred to as the first and second supporting members, respectively, hereinafter.

The first and second supporting members 12A,12B were each coated with a silicone-based adhesive in a thickness of 0.020 mm and adhesively bonded each to the other in a jig for adhesive bonding together with the slitted metal sheet prepared above followed by trimming for the metal filament alignment 12C thus to obtain a press-contact connector 12 having a generally point-symmetrical X-formed cross section (see FIG. 2) having a width of 1.5 mm, height of 1.5 mm and length of 15 mm with the aligned metal filaments 12C to serve as the electroconductor body.

Further separately, a metal-made clip member 14 having a width of 2.5 mm, height of 2.0 mm and length of 40 mm was prepared from a 0.010 mm thick stainless steel sheet which was subjected to a press-punching work in a profile of the development of the member 14 illustrated in FIG. 2 followed by a bending work of the development sheet into the clip member 14 having two clipping parts 14A,14A each having a U-formed cross section at the end portions of the clip member 14.

The thus prepared clip member 14 was then adhesively bonded by using a silicone-based adhesive at the flap portion 14B to the press-contact connector 12 having a generally X-formed cross section to complete a connector device 10 consisting of the connector 12 and the clip member 14.

The connector device 10 was secured to a chip-on-glass-type ("COG-type") LCD panel 102 by pinching a periphery of the LCD panel 102 with the clipping parts 14A, 14A at the positions not to overlay the electrode terminals 102A to form an assembly which was encased in a casing 105 and mounted on and pressed against a circuit board 101 with a spacer 104 interposed therebetween thus to bring the electrode terminals 102A on the LCD panel 102 and the electrode terminals 101A on the circuit board 101 into electrical connection through the metal filament alignment 12C in the press-contact connector device 10 which was secured to the LCD panel 102 by means of the clip member 14. The electrical connection between the sets of electrode terminals 101A and 102A was found to be very stable absolutely without shakiness.

EXAMPLE 2

Figure 3A:
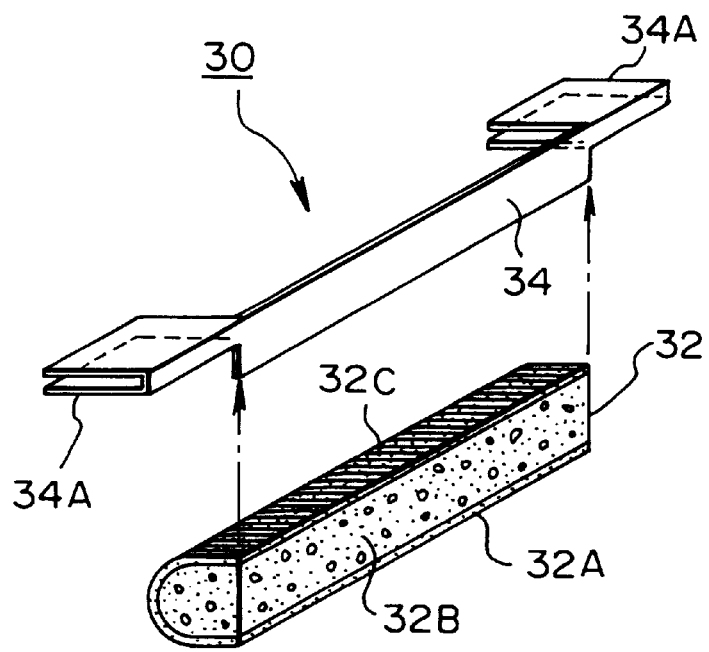
FIG. 3A is a perspective view of the connector device of Example 2 disassembled into a press-contact connector and a clip member and FIG. 3B is a perspective view thereof as integrated.
Figure 3B:
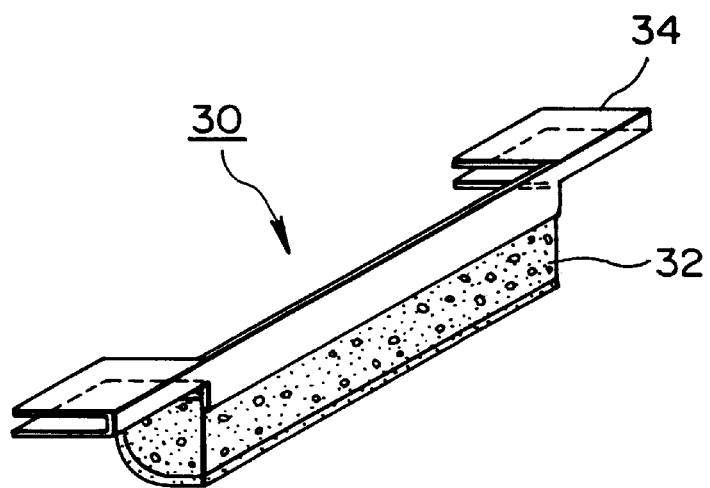

Following is a description of the preparation of the connector device 30 illustrated by a perspective view in FIGS. 3A and 3B for the parts disassembled and the assembled connector device per se, respectively.

Brass wires 32C of 0.040 mm diameter provided with an under-plating layer of nickel and top plating layer of gold were aligned at a regular pitch of 0.10 mm on a 0.10 mm thick uncured silicone rubber sheet to have a rubber hardness of 50° H after curing followed by a heat treatment at 120° C. for 30 minutes to cure the silicone rubber sheet. The thus cured silicone rubber sheet supporting the brass wires 32C in alignment was subjected to slitting in a direction perpendicular to the running direction of the brass wires 32C into strips having a width of 9 mm.

This 9 mm wide rubber strip 32A was then set on a jig having a groove-formed cavity of a U-formed cross section of 3 mm width and 2 mm depth in such a fashion that the aligned brass wires 32C supported on the rubber sheet 32A were in direct contact with the cavity surface and the cavity behind the cured rubber sheet 32A was filled with an uncured foamable silicone rubber composition 32B under a covering followed by a heat treatment at 120° C. for 5 minutes to effect expansion and curing of the foamable silicone rubber composition into a foamed rubber body 32B of 20° H rubber hardness which was integrated with the cured rubber sheet 32A. The thus integrated body was taken out of the jig and divided by cutting in the length-wise direction into individual connectors 32 of a U-formed cross section each having a length of 10 mm, width of 2 mm and height of 3 mm, of which the aligned brass wires 32C served as the conductor body.

Separately, a clip member 34 having a length of 30 mm, width of 2.5 mm and height of 2.0 mm as shown in FIG. 3A was prepared from a 0.10 mm thick stainless steel sheet in the same manner as in the preparation of the clip member 14 in Example 1. This clip member 34 was adhesively bonded by using a silicone-based adhesive to the flat surface of the connector 32 to give a connector device 30 illustrated in FIG. 3B.

The connector device 30 was secured to a LCD panel by clipping a periphery of the LCD panel having an array of electrode terminals with the clipping parts 34A,34A in such a fashion that the electrode terminals thereon were in contact with the aligned brass wires 32C on the connector 32. The LCD panel securing the connector device 30 was pressed against a circuit board in such a fashion that the electrode terminals thereon were in contact with the aligned brass wires 32C of the connector 32 to find that the LCD panel could be driven with stability.

EXAMPLE 3

A connector device 40 illustrated in FIGS. 4A and 4B was prepared as described below.

Brass wires 42C of 0.030 mm diameter having an under-plating of nickel and top plating of gold were put on a first uncured silicone rubber sheet of 0.10 mm thickness in alignment at a pitch of 0.05 mm. A second uncured silicone rubber sheet of also 0.10 mm thickness was put on the array of the brass wires 42C which were sandwiched between the two uncured silicone rubber sheets followed by a heat treatment at 120° C. for 30 minutes so that the silicone rubber sheets were cured into cured rubber sheets of 30° H rubber hardness to give an integral silicone rubber sheet 41 holding the array of the brass wires 42C embedded therein. Two silicone rubber sheets 42A,42B of 0.9 mm thickness having a rubber hardness of 30° H to serve as supporting members were adhesively bonded with intervention of a 0.020 mm thick adhesive layer to both surfaces of the wire-supporting rubber sheet 41 followed by a heat treatment at 120° C. for 10 minutes. The thus obtained laminated sheet 42 holding the array of the brass wires 42C was subjected to slitting into strips having a width of 5 mm in the running direction of the brass wires 42C and each strip was divided into connector bodies 42 of 20 mm length as illustrated in FIG. 4A.

Separately, a clip member 44 having a length of 30 mm, width of 3 mm and height of 3 mm as illustrated in FIG. 4A was prepared by a bending work of a cut sheet of a 0.080 mm thick stainless steel sheet. Each of the clipping parts 44A, 44A at both ends of the clip member 44 had a C-formed cross section. This clip member 44 was adhesively bonded by using a silicone-based adhesive to the surface of the supporting member 42A of the connector 42 to give a connector device 40 illustrated in FIG. 4B.

The connector device 40 was secured to a COG-type LCD panel by clipping a periphery of the LCD panel having an array of electrode terminals with the clipping parts 44A,44A in such a fashion that the electrode terminals thereon were in contact with the aligned brass wires 42C of the connector 42. The LCD panel securing the connector device 40 was pressed against a circuit board in such a fashion that the electrode terminals thereon were in contact with the aligned brass wires 42C of the connector 42 to find that the LCD panel could be driven with stability.

EXAMPLE 4

Following is a description of the preparation procedure of the connector device 50 illustrated in FIGS. 5A and 5B.

Brass wires 52C of 0.040 mm diameter having an under-plating of nickel and top plating of gold were put on a first uncured silicone rubber sheet of 0.10 mm thickness in alignment at a pitch of 0.2 mm. A second uncured silicone rubber sheet of also 0.10 mm thickness was put on the array of the brass wires 52C which were sandwiched between the two uncured silicone rubber sheets followed by a heat treatment at 120° C. for 30 minutes so that the silicone rubber sheets were cured into cured rubber sheets of 50° H rubber hardness to give an integral silicone rubber sheet holding the array of brass wires 52C embedded therein.

Ten of the thus prepared brass wire-holding rubber sheets were stacked one on the other in such a fashion that the running directions of the brass wires 52C in the respective sheets were the same to give a laminated sheet which was subjected to a heat treatment at 120° C. for 10 minutes under compression to give an integral laminated rubber sheet 52 holding ten parallel arrays of the brass wires 52C embedded within a matrix phase 52A of the cured silicone rubber, which was divided by cutting into connectors 52 having a length of 15 mm, width of 2 mm and height of 2.5 mm as illustrated in FIG. 5A.

Separately, a stainless steel clip member 54 having a length of 25 mm, width of 3 mm and height of 3 mm as illustrated in FIG. 5A was prepared in the same manner as in the preparation of the clip member 44 in Example 3 from a stainless steel sheet of 0.10 mm thickness. This clip member 54 having clipping parts 54A,54A of C-formed cross section was adhesively bonded to the connector 52 by using a silicone-based adhesive to give a connector device 50 illustrated in FIG. 5B.

The connector device 50 was secured to a COG-type LCD panel by clipping a periphery of the LCD panel having an array of electrode terminals with the clipping parts 54A,54A with resilience in such a fashion that the electrode terminals thereon were in contact with the aligned brass wires 52C of the connector 52. The LCD panel securing the connector device 50 was pressed against a circuit board in such a fashion that the electrode terminals thereon were in contact with the aligned brass wires 52C of the connector 52 to find that the LCD panel could be driven with stability.

EXAMPLE 5

Following is a description of the preparation procedure of the connector device 60 illustrated in FIGS. 6A and 6B.

A plurality of uncured insulating silicone rubber sheets of 0.050 mm thickness and a plurality of uncured electroconductive silicone rubber sheets of 0.050 mm thickness were stacked alternately one on the other to give a laminated block which was subjected to a heat treatment under compression to give a stratified cured rubber block alternately consisting of insulating and conductive silicone rubber layers, which was sliced in a plane perpendicular to the laminating direction of the layers to give striped rubber sheets 61 of each 0.6 mm thickness consisting of alternately aligned stripes 62A and 62C of the insulating and conductive, respectively, silicone rubbers.

The thus obtained striped rubber sheet 61 was coated on both surfaces with a silicone-based adhesive in a thickness of 0.020 mm and a 0.93 mm thick silicone rubber sheet of 20° H rubber hardness as a supporting member was bonded to each of the adhesive-coated surfaces of the striped rubber sheet 61 followed by a heat treatment at 140° C. for 10 minutes so as to have the striped rubber sheet 61 sandwiched between the supporting members 62B,62B, which was then divided by cutting to give individual rubber connectors 62 each having a length of 30 mm, width of 2.5 mm and height of 3.0 mm as illustrated in FIG. 6A.

Separately, a stainless steel clip member 64 having a length of 45 mm, width of 3 mm and height of 3 mm as illustrated in FIG. 6A was prepared in the same manner as in the preparation of the clip member 44 in Example 3 from a stainless steel sheet of 0.10 mm thickness. This clip member 64 having clipping parts 64A,64A was adhesively bonded to the connector 62 by using a silicone-based adhesive to give a connector device 60 illustrated in FIG. 6B.

The connector device 60 was secured to a LCD panel by clipping a periphery of the LCD panel having an array of electrode terminals with the clipping parts 64A,64A with resilience in such a fashion that the electrode terminals thereon were in contact with the conductive stripes 62C of the connector 62. The LCD panel securing the connector device 60 was pressed against a circuit board in such a fashion that the electrode terminals thereon were in contact with the conductive stripes 62C of the connector 62 to find that the LCD panel could be driven with stability.

What is claimed is:

1. A method for electrically connecting a first electrode terminal array on a first electronic board unit and a second electrode terminal array on a second electronic board unit, said method comprising:

forming a connector device by integrally joining a press-contact connector with a clip member, wherein said press-contact connector comprises conductor bodies, said clip member is formed of metallic material, and said clip member comprises clipping parts;

securing said connector device to said first electronic board unit by clipping a periphery of said first electronic board unit with said clipping parts at a position that is not on said first electrode terminal array of said first electronic board unit such that said first electrode terminal array is in contact with said conductor bodies of said press-contact connector;

bringing said conductor bodies of said press-contact connector into contact with said second electrode terminal array on said second electronic board unit; and compressing said press-contact connector between said first electrode terminal array and said second electrode terminal array so as to electrically connect said first electrode terminal array and second electrode terminal array through said conductor bodies of said press-contact connector.

2. The method as claimed in claim 1, wherein said clip member is an elongated body having two ends with respective clipping parts.

3. The method as claimed in claim 2, wherein each of said clipping parts has a U-formed or C-formed cross section with two free legs between which a periphery of said first electronic board unit is resiliently pinched to secure said connector device.

4. The method as claimed in claim 2, wherein securing said connector device to said first electronic board unit further comprises clipping said clipping parts on opposite sides of said first electrode terminal array.

5. An electronic assembly comprising:

a first electronic board unit having an array of electrode terminals;

a second electronic board unit having an array of electrode terminals; and a connector device integrally comprising a press-contact connector and a clip member, said press-contact connector including conductor bodies, said clip member including clipping parts, wherein said connector device is secured to said first electronic board unit so that said press-contact connector is interposed between said arrays of electrode terminals of said first and second electronic board units, wherein said connector device is secured to said first electronic board unit by clipping, and wherein said clipping parts are clipped to said first electronic board unit without clipping said array of electrode terminals on said first electronic board unit with said clipping parts, and said conductor bodies are in resilient contact with said array of electrode terminals on said first electronic board unit and said array of electrode terminals on said second electronic board unit.

6. The electronic assembly as claimed in claim 5, wherein said press-contact connector has an X-shaped cross section, said press-contact connector comprises first and second supporting members, and said conductor bodies are aligned metal filaments.

7. The electronic assembly as claimed in claim 5, wherein said press-contact connector has a U-shaped cross section, and conductor bodies are wire connectors partially surrounding a rubber sheet.

8. The electronic assembly as claimed in claim 5, wherein said press-contact connector has a rectangular cross section, and conductor bodies are an array of wire connectors sandwiched between tow rubber sheets.

9. The electronic assembly as claimed in claim 5, wherein said press-contact connector has a rectangular cross section, and conductor bodies are a matrix of wire connectors said matrix of wire connectors comprising a plurality of arrays of wire connectors sandwiched between two rubber sheets.

10. An electronic assembly comprising:
   a first electronic board unit having an array of electrode terminals;
   a second electronic board unit having an array of electrode terminals; and
   a connector device integrally comprising a press-contact connector and a clip member, said clip member having a pair of clipping parts,
   said press-contact connector including a stratified rubber sheet sandwiched between a pair of rubber connectors;
   said stratified rubber sheet having alternating insulating and conducting silicone rubber layers,
   wherein said connector device is secured to said first electronic board unit so that said press-contact connector is interposed between said arrays of electrode terminals of said first and second electronic board units,
   wherein said connector device is secured to said first electronic board unit by clipping, and
   wherein said clipping parts are clipped to said first electronic board unit without clipping said array of electrode terminals on said first electronic board unit with said clipping parts, and said conductor bodies are in resilient contact with said array of electrode terminals on said first electronic board unit and said array of electrode terminals on said second electronic board unit.

\* \* \* \* \*